United States Patent
Devitt

(10) Patent No.: US 8,795,769 B2
(45) Date of Patent: Aug. 5, 2014

(54) METHOD AND A DEVICE FOR DEPOSITING A FILM OF MATERIAL OR OTHERWISE PROCESSING OR INSPECTING, A SUBSTRATE AS IT PASSES THROUGH A VACUUM ENVIRONMENT GUIDED BY A PLURALITY OF OPPOSING AND BALANCED AIR BEARING LANDS AND SEALED BY DIFFERENTIALLY PUMPED GROVES AND SEALING LANDS IN A NON-CONTACT MANNER

(75) Inventor: Andrew J. Devitt, Media, PA (US)

(73) Assignee: New Way Machine Components, Inc., Aston, PA (US)

(*) Notice: Subject to any disclaimer, the term of this patent is extended or adjusted under 35 U.S.C. 154(b) by 1100 days.

(21) Appl. No.: 11/497,531

(22) Filed: Aug. 2, 2006

(65) Prior Publication Data

US 2007/0031600 A1 Feb. 8, 2007

Related U.S. Application Data

(60) Provisional application No. 60/704,453, filed on Aug. 2, 2005.

(51) Int. Cl.
*C23C 14/56* (2006.01)
(52) U.S. Cl.
CPC .................... *C23C 14/562* (2013.01)
USPC ........................................ 427/248.1; 118/718
(58) Field of Classification Search
CPC ............................. C23C 14/56; C23C 14/562
See application file for complete search history.

(56) References Cited

U.S. PATENT DOCUMENTS

| | | | |
|---|---|---|---|
| 3,223,501 A | 12/1965 | Fredley et al. | |
| 3,665,730 A | 5/1972 | Linzer | |
| 4,186,918 A | 2/1980 | Ficker et al. | |
| 4,618,292 A | 10/1986 | Judge et al. | |
| 4,663,197 A | 5/1987 | Bok | |
| 4,749,283 A | 6/1988 | Yokomatsu | |
| 4,785,985 A | 11/1988 | Hurtgen | |
| 5,017,404 A * | 5/1991 | Paquet et al. | ........... 427/573 |
| 5,104,237 A | 4/1992 | Slocum | |
| 5,133,561 A | 7/1992 | Hattori | |
| 5,246,331 A | 9/1993 | Hallahan et al. | |
| 5,343,616 A | 9/1994 | Roberts | |

(Continued)

FOREIGN PATENT DOCUMENTS

| | | | |
|---|---|---|---|
| DE | 19836527 | | 2/2000 |
| JP | 363020469 | * | 1/1988 |

(Continued)

OTHER PUBLICATIONS

The State's University, Basic Definitions, Oklahoma State University, 2006.

*Primary Examiner* — Michael Cleveland
*Assistant Examiner* — Joel Horning
(74) *Attorney, Agent, or Firm* — Volpe and Koenig, P.C.

(57) ABSTRACT

A method and apparatus for coating and baking and deposition of surfaces on glass substrate or flexible substrate, such as films and thin glass sheets or other similar work pieces as it transitions thru and between small gaps of aero-static or hydro-static porous media bearings and differentially pumped vacuum grooves, in a non-contact manner, in order to process within a vacuum environment. The process is also intended to incorporate simultaneous and immediately sequential ordering of various processes.

20 Claims, 3 Drawing Sheets

(56) References Cited

U.S. PATENT DOCUMENTS

| | | |
|---|---|---|
| 5,423,468 A | 6/1995 | Liedtke |
| 5,488,771 A | 2/1996 | Devitt et al. |
| 5,675,856 A | 10/1997 | Itzkowitz |
| 5,730,801 A | 3/1998 | Tepman et al. |
| 6,013,375 A | 1/2000 | Maltby |
| 6,101,845 A | 8/2000 | Kojima et al. |
| 6,126,169 A * | 10/2000 | Sogard et al. .......... 277/321 |
| 6,149,759 A | 11/2000 | Guggenberger |
| 6,163,033 A | 12/2000 | Smick et al. |
| 6,220,056 B1 | 4/2001 | Ostendarp |
| 6,281,136 B1 | 8/2001 | Kim |
| 6,515,288 B1 * | 2/2003 | Ryding et al. .......... 250/441.11 |
| 6,539,952 B2 | 4/2003 | Itzkowitz |
| 6,540,001 B1 | 4/2003 | McNestry |
| 6,564,421 B2 | 5/2003 | Park et al. |
| 6,644,703 B1 | 11/2003 | Levin et al. |
| 6,749,729 B1 * | 6/2004 | Xu et al. .......... 204/298.15 |
| 6,781,684 B1 | 8/2004 | Ekhoff |
| 6,810,297 B2 | 10/2004 | Adin et al. |
| 6,869,484 B2 | 3/2005 | Hunt et al. |
| 6,899,765 B2 | 5/2005 | Krivts et al. |
| 6,932,873 B2 | 8/2005 | Rechav et al. |
| 2002/0135761 A1 | 9/2002 | Powell et al. |
| 2003/0044539 A1 * | 3/2003 | Oswald .......... 427/404 |
| 2003/0169524 A1 | 9/2003 | Adin et al. |
| 2003/0177790 A1 | 9/2003 | Langsdorf |
| 2004/0003829 A1 | 1/2004 | Hirae |
| 2004/0020438 A1 * | 2/2004 | Rechav et al. .......... 118/728 |
| 2005/0050760 A1 | 3/2005 | Itoh |
| 2006/0060259 A1 | 3/2006 | Devitt |
| 2007/0031600 A1 | 2/2007 | Devitt |
| 2007/0175499 A1 | 8/2007 | Yassour et al. |

FOREIGN PATENT DOCUMENTS

| | | | |
|---|---|---|---|
| WO | WO 99/61678 | | 12/1999 |
| WO | WO03/060961 | * | 7/2003 |
| WO | WO 03/060961 | | 7/2003 |
| WO | WO 03060961 A1 | * | 7/2003 |
| WO | WO 2004/089792 | | 10/2004 |

* cited by examiner

METHOD AND A DEVICE FOR DEPOSITING A FILM OF MATERIAL OR OTHERWISE PROCESSING OR INSPECTING, A SUBSTRATE AS IT PASSES THROUGH A VACUUM ENVIRONMENT GUIDED BY A PLURALITY OF OPPOSING AND BALANCED AIR BEARING LANDS AND SEALED BY DIFFERENTIALLY PUMPED GROVES AND SEALING LANDS IN A NON-CONTACT MANNER

REFERENCE TO RELATED APPLICATION

The present application claims the benefit of U.S. Provisional Patent Application No. 60/704,453, filed Aug. 2, 2005, whose disclosure is hereby incorporated by reference in its entirety into the present disclosure.

FIELD OF THE INVENTION

The present invention relates to a coating, baking and deposition apparatus for the semi-conductor industry, solar elements, as well as the precision panel substrate elements, film substrate industry, integrated circuit, and panel circuit boards also such other like devices and substrates arise, the usefulness of the present invention in those applications will be readily apparent.

DESCRIPTION OF RELATED ART

In the FPD industry ever larger sheets of glass are being employed in the manufacture of Flat Panel Displays. The processing of these sheets is expensive in that their increasing size makes handling difficult regarding the brittle nature of the glass, due to its thin cross section—precluding anything but the gentlest method of transference. Because the required surface finish is intolerant of any type of defect or contamination manufacturers are increasingly moving towards non-contact conveyance of the panels in handling and processing in order to increase the yield rate. The manufacturing process of the substrate sheets of glass require many operations to before they can be integrated with other components. In order for the substrates to perform properly, they must be processed to a high degree of accuracy. This would include coating without contamination, streaking and marks, drying, and either coating any number of different ways, and or baking to finish a particular process correctly without blemish or defect. Further increasing the difficulty in processing is the need to perform some operations in a vacuum environment to insure non-contamination of the coating process.

Because the handling and processing of FPD glass is so similar to wafers and circuit boards and other elements inherent in the semi-conductor industry, it is anticipated by the inventor that this method and/or apparatus and invention is directly transferable and translatable to the semiconductor industry and its attendant requirements of manufacturing production. Also the usefulness of the invention when processing flexible film substrates and webs in a continual method should be readily apparent.

Coating

Various means of coating are employed in industry. A common method for coating is to pass the substrate beneath a curtain of material which deposits a material upon the substrate in a random orientation and thickness, or to have a type of "Shower head" which deposits an even layer of material on the substrate. This is unsatisfactory since the thickness of the coating and the processing parameters need to be controlled for precision applications, also since the size of the apparatus required for ever larger generations of glass is prohibitive, since such equipment must be operated in a clean room environment in order to prevent contamination from particles. Substrates can be dipped and or sprayed as well—neither of which is suitable for FPD glass, or semi-conductor industry products due to handling issues and a lack of assurance of non-contamination. Still a common further method is the use of "Chemical Vapor Deposition" where a substrate is placed within a chamber containing a heater in a vacuum environment which heats up and evaporates the coating material to be applied. Subsequently the evaporated material settles on all the surfaces of the chamber, which include the substrate material to be coated. Very precise thickness coatings can be attained in this manner, however the size of the FPD glass, and some Integrated Circuits and wafers pose a problem regarding the subsequent size of the vacuum vessel needed to accommodate these substrates. Also, the processing time required to create the vacuum environment for larger panels is deleterious to lower cost processing and ease of application. This process also must take place in a clean room, the floor space for which is expensive.

Drying & Baking

During a cleaning process involving water upon a substrate or device requiring such high tolerances as are required in the FPD and semiconductor industries the substrate will need to be dried. Critical to this process is no remaining moisture on the surface, and also to insure that there is no streaking and or impurities remaining on the surface of the substrate due to their presence in the cleaning solution which has then evaporated away, leaving them behind. Further, there are some processes within the aforementioned industries that require a baking process. This entails a higher order of heat and or application of radiant heat and light to enhance a process, or complete a curing of a coating, or similar elements.

Conventional drying for FPD glass involves heating and placing the substrate within a chamber and causing the substrate to dwell there, while a heat source is applied to remove any moisture. Problems associated with un-even heating arise in that if the heat source is not applied evenly to the substrate surface, warping and or variations in the surface quality can occur, as well as areas where there is more rapid evaporation of the rinse water from the cleaning process, leaving behind streaks and or water spots.

Still further, baking presents problems to the cleanliness of the clean room environment, since the presence of high heat sources can create unwanted particulate and contamination in clean room environments through the opening and closing of the chamber used to heat the substrates.

Within the semi-conductor industry discreet chambers are used where the wafers can be dried, or baked. The substrate must be moved to those chambers. Likewise in the FPD market, drying is usually accomplished as part of the cleaning process in separate drying and baking chambers.

SUMMARY OF THE INVENTION

Accordingly, the present invention is directed to method and apparatus for coating and baking glass substrate and semiconductor industry flat panel substrates, as well as flexible substrates and webs that substantially obviates one or more of the problems due to limitations and disadvantages of the related art.

An object of the present invention is to provide a method and apparatus for coating and baking FPD glass and semiconductor substrates having a thin thickness and semi-uniform surface contained within an apparatus that allows for in-line processing and or controlled mini-environments for especially large panels in a substantially low pressure, or near perfect vacuum environment which greatly aides in the cleanliness, and non-contamination via particulates in the process of coating and baking said substrates.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

Drying & Baking

Through the use of successive differentially pumped grooves, axially placed relative to the substrate travel, a vacuum environment is created, as described in U.S. Pat. No. 6,515,288 Ryding, et al. enclosed herein as a reference, successive grooves are employed, leading to a chamber created by adding a larger cutaway in which a substantially lower pressure near vacuum is encapsulated and drawn down with external pumping means. This chamber allows an evaporative chemical vapor deposition (CVD) or plasma vapor deposition (PVD) process to be performed. The CVD/PVD process can be adjusted in order to deposit the desired thickness on the glass, or substrate. By heating the desired coating material, a type of gas is created, which causes particulate from the CVD/PVD process to condense on all surfaces within the chamber, including the desired substrate. Since there is a near perfect vacuum, there is no contamination via particulates or unwanted materials. The speed with which the substrate is moved through the apparatus can also be modulated in order to control the thickness. As the deposition process occurs, the substrate moves through the same number of differentially pumped grooves, only this time in increasingly higher levels of pressure, mirroring the initial series of grooves in reverse. In this way, a type of vacuum chamber is created within the middle of the process, insuring that outside ambient air is unable to penetrate, and appropriate vacuum pressures are reached as is required by the CVD/PVD process.

In a further embodiment, the process can be performed as above, however within the CVD/PVD chamber, since the process requires equal pressure on both sides of the substrate, the process conditions are the same below the substrate, thereby not one evaporative source, but two can be used—one on the upper surface of the substrate, and one directly below, allowing equal coating on both sides of the substrate.

In yet a further embodiment of the described invention, a method can be integrated into the above described processes where the air supplied to the aerostatic bearings is temperature-controlled in preparation for a coating supplied by an axial slit type applicator. The aerostatic bearing on the top surface of the substrate is configured with numerous evenly placed holes along grooves longitudinally along the bearings, in the direction of the substrate processing direction. The holes supply a vacuum force which is substantially greater than the weight of the substrate, effectively pulling the glass against the aerostatic bearing lands for a precise gap between the bearing and the substrate. This enables the substrate to be introduced to the slit coater with micron level precision in the distance to the slit coater. This distance from the substrate to the coating orifice is important with certain types of coatings and insures an accurate thickness layer is applied. After the coating head, there are no longer any vacuum grooves in the aerostatic bearing which is holding the glass up against it; in fact the preferred embodiment is to have nothing near the substrate coating, so effectively a space is created within the apparatus, allowing the substrate coating to dry. The substrate is transported by a lower aerostatic bearing which supports the substrate as it is "handed off" from the upper aerostatic bearing, through the coater, then to be supported by the lower aerostatic bearing. This allows the coating to dry properly as well as avoid transcription effects which can occur should there be any temperature variations on the surface of the substrate during and after the coating process. The apparatus could then conceivably incorporate various drying and baking or further etching elements in order to enhance the coating performance.

Baking

In yet another embodiment to the process similarly described above under Coating, there is a cutout similar to that described above. However here there is simply a high heat source specifically for the purpose of baking the substrate, whether to cure a coating, prepare the substrate for some other process requiring high heat, or for further processes inherent in the manufacturing process. Since the process is contained within a vacuum environment, extremely high heat can be affected upon the substrate or web in a safe manner, as it is completely contained. Also the prevention of introduction of contaminate is assured since the chamber is hermetically sealed against ingress of even air. The process can incorporate flash baking, Ultra Violet radiation, Plasma heating, radiant heat, and Nuclear radiation, Rapid Thermal Processing, and Annealing.

The high heat source can, as described above, be situated on both sides of the substrate—above and below, and can be of numerous different means, as described immediately above. The simultaneous processing of both sides of the substrate in a non-contact nature of disposition is of great importance in some applications, and seen a major benefit of the invention, as well as the ability to perform rapid thermal processing and annealing.

Combination of Stages

Within the manufacturing arena, floor space of machinery used to process the FPD sheets or substrates within a clean room environment is costly due to the necessary processes required in maintaining such an environment. Any way to minimize the amount of floor space required is advantageous. For this reason, a further aspect of the apparatus is the inline coordination and inclusion of each element described above, the resulting savings in floor space within the clean room environment is substantial thereby realizing a large cost savings. Also the process is internal to the apparatus realizing significant benefits for the prevention of contamination of the clean room from any attendant aspects of any of the processes, as each stage can be performed on the substrate immediately after the previous one, insuring no contamination of the substrate passing from one operation to another.

Prior to this invention each step is performed separately, within the particular process's own arena on the manufacturing line, thereby requiring significant floor space and the attendant conveyance equipment required to safely transport the substrate between the manufacturing processes. A further aspect of the preferred embodiment entails the processing of substrates and especially large substrates in processes as described above but in an immediately sequential fashion. This includes individually sequential ordering but also is to include simultaneous processing, so that a substrate conceivably could have any number of processes being performed at once, which is especially useful for web type substrates. Such improvements are perceived by its inventor as a significant enhancement in a growing industry which can potentially realize large cost savings while improving overall processes parameters at the same time.

It is to be understood that both the foregoing general description and the following detailed description are exemplary and explanatory and are intended to provide a further detailed explanation of the invention as claimed but do not constitute the entirety of potential embodiment. For instance, the figures are drawn in profile, but it is to be understood that the embodiment represents an apparatus and method that fully encapsulates, either partially or fully the width of a substrate, and or the entire length, or a section such as in a web embodiment.

DETAILED DESCRIPTION OF THE PREFERRED EMBODIMENT

As will be understood by those skilled in the art, the present invention may be embodied in other specific forms or configurations without departing from the essential characteristics or spirit and scope thereof. Accordingly, the foregoing description is intended to be illustrative, but not limiting, of the scope of the invention which is set forth in the following claims. Thus it is intended that the present invention cover the modifications and variations of this intention provided they come within the scope of the appended claims and their equivalents.

Coating/Baking—Flat Substrate

Figure 1:
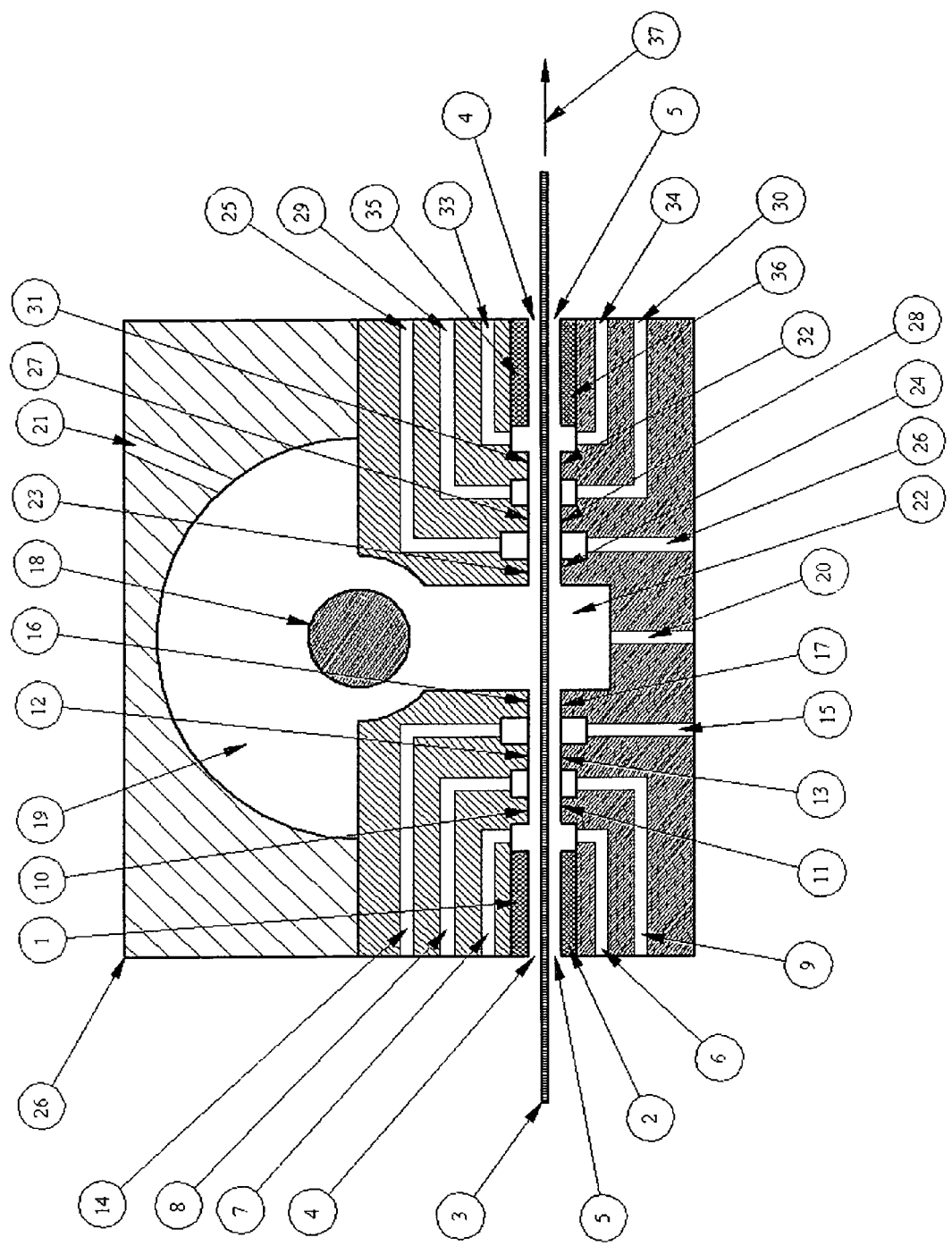
FIG. 1 is a schematic view of a Chemical vapor deposition, Plasma vapor deposition/Baking/Annealing process showing the vertically opposed aerostatic bearings, the substrate, and the attendant pressures of areas within apparatus.

In the preferred embodiment, FIG. 1 represents the coating of a substrate, such as a Chemical Vapor Deposition (CVD) method. This method requires a vacuum in order to be viable, and as is disclosed in U.S. Pat. No. 6,163,033 Smick (enclosed herein for reference) the use of differentially pumped grooves, for forming a moving dynamic seal and is here so employed. A substrate 3, such as FPD glass, or semi conductor wafers, is passed in a direction 37 between two aerostatic bearings 1, 2 vertically disposed one over the other. The bearings are charged with a gas, nitrogen, carbon dioxide or air through grooves (not shown) supplied in the apparatus housing 26 at a pressure of roughly 60 Psi. The bearings 1, 2 are so disposed around the substrate 3 in such a way as to form narrow gaps 4, 5 which cause equal pressure build up from the bearings, displacing the substrate in the center of the bearings, creating a non-contact situation. These bearings are substantially parallel and co-linear to the other bearings and lands within the apparatus, allowing a consistent thin gap 4, 5 to be formed between substrate 3 and the various lands. Immediately adjacent to the aerostatic bearings 4, 5 are grooves 6, 7 which are ambient grooves, designed to allow the air or fluid flowing off of aerostatic bearings 4, 5 to be naturally displaced, back to ambient air. Further into the apparatus in direction of substrate travel 27, separating grooves 6, 7 from a further set of grooves 8, 9, are two lands, 10, 11. These grooves 8, 9 are attached to a roughing vacuum pump (not shown) which normally would be of the type of rotary vane vacuum pumps, typically with up to 30 cubic feet per minute of flow, but possibly more or less. These grooves 8, 9 are designed to scavenge air flowing over lands 10, 11 from ambient grooves 6, 7 and air escaping from bearings 1, 2. Grooves 8, 9 are designed to direct the majority of air flowing into the apparatus through narrow gaps 4, 5 between substrate 3 and the various lands, away, and out of the apparatus. Immediately adjacent to grooves 8, 9 in the direction of substrate 3 travel 37 are lands 12, 13. These lands are substantially parallel and co-linear to the other lands, allowing a consistent thin gap 4, 5 to be formed between substrate 3 and the various lands. Adjacent to lands 12, 13 are grooves 14, 15. Said gaps are connected to any number of means of vacuum type apparatus, for instance Vacuum Molecular turbo pumps (not shown) and the like in order to create a vacuum within the grooves of $10^4$ Torr or −5.3 Millibars. Grooves 14, 15 are then able to fully evacuate any air that leaked past grooves 8, 9 while at the same time maintaining equal pressure upon the substrate 3. Immediately adjacent to grooves 14, 15 are lands 16, 17. These lands are substantially parallel and co-linear to the other lands, allowing a consistent thin gap 4, 5 to be formed between substrate 3 and the various lands. Lands 16, 17 separate grooves 14, 15 from the main chamber 19. Chamber 19 is axially arranged, and represents a large cutout within the apparatus yet is completely contained therein. There is a mirror, axially arranged chamber 22 immediately opposite chamber 19, which may be smaller volumetrically, but represents the same surface area on the substrate 3. Both chambers are kept at a pressure of $10^4$ Torr or −5.3 Millibars so that the pressure on the substrate 3 is maintained as equal, so as not to cause undue material deflection via channels 21, 20 which are attached to a Vacuum Molecular turbo pump(s) or similar apparatus (not shown). The pressure maintained in chambers 19, 22 is near the pressure of grooves 14, 15 and is designed to remove enough air or ambient gas in order to maintain an environment suitable for CVD. Within chamber 19 is placed a CVD (Chemical Vapor Deposition) apparatus 18 which is heated through alternate means (not shown) and creates a vapor (not shown) which condenses evenly on all exposed surfaces, including the glass substrate 3. The process allows for extremely precise surface deposition on the order of 3-5 μm (microns) or less. The speed with which the substrate 3 is moved through the apparatus, and the rate with which the CVD process is operated dictate the layer thickness, and each can be modified to suit desired manufacturing goals. As the substrate leaves the chambers 19, 22, the process of lands and successive grooves is reversed, in that lands are formed 23, 24 in order to separate axial grooves 25, 26 from chambers 19, 22 and are pumped via Turbo Molecular pumps (not shown) in order to create a pressure of $10^{-4}$ Torr or −5.3 Millibars within the groove. These lands are substantially parallel and co-linear to the other lands, allowing a consistent thin gap 4, 5 to be formed between substrate 3 and the various lands. Immediately adjacent to grooves 25, 26 is lands 27, 28 which lands are substantially parallel and co-linear to the other lands, allowing a consistent thin gap 4, 5 to be formed between substrate 3 and the various lands. Further in direction of substrate travel 37 are axial grooves 29, 30, which are pumped via a rotary van vacuum pump (not shown) to scavenge air that will be flowing between thin gaps 4, 5 formed by the substrate 3 and aerostatic bearings 35, 36. Immediately adjacent to grooves 29, 30 in direction of substrate travel 3 are lands 31, 32, which lands are substantially parallel and co-linear to the other lands, allowing a consistent thin gap 4, 5 to be formed between substrate 3 and the various lands. These lands separate grooves 29, 30 from ambient axial grooves 33, 34. The ambient groove vents to atmosphere outside of the apparatus, in order to allow air to flow evenly off of the surface of the aerostatic bearings. Immediately adjacent to ambient grooves 33, 34 are aerostatic bearings 35, 36 vertically disposed opposite one another, through which 60 Psi air pressure or some other fluid as may be desired for a given process, such as carbon dioxide or nitrogen is passed in order to impinge on the surface of the substrate equally and cause it to remain substantially between them in a non-contact state. A thin gap is created 4, 5 and this gap is maintained throughout the travel of substrate 3 through the apparatus, maintaining a non-contact orientation.

In a further embodiment, a similar apparatus is created, however chamber 22 is made to be similarly disposed in size and orientation as chamber 19, thereby allowing a CVD apparatus to be placed within chamber 22. This allows the deposition of material onto both sides of the substrate, for various unique, non-contact applications, heretofore not viable with the current state of technology. The attendant pressures and apparatus embodiment can be substantially similar, but not necessarily so. Any combination of pressures or vacuum related chambers is anticipated by the inventor, and is not specifically limited to the foregoing.

Within the above embodiment in FIG. 1, chamber 19 may contain any number of different processing devices, namely baking apparatus 18 through the use of Ultra-Violet radiation, Radiant heat, Plasma heating, nuclear radiation, rapid thermal processing, annealing and numerous other types of processing conditions. The construction of the chamber 19 can be arranged thus with coatings or shielding as is appropriate to the process. Intense heat can be created for the purposes of baking the substrate 3, and the speed of movement of the substrate 3 can be modified to affect the desire result. A second matching chamber 22 immediately below the upper chamber 19 and equal in size can hold the same apparatus (not shown) in order to effect baking on both sides of the substrate simultaneously.

Coating/Baking—Flexible Substrates

Figure 2:
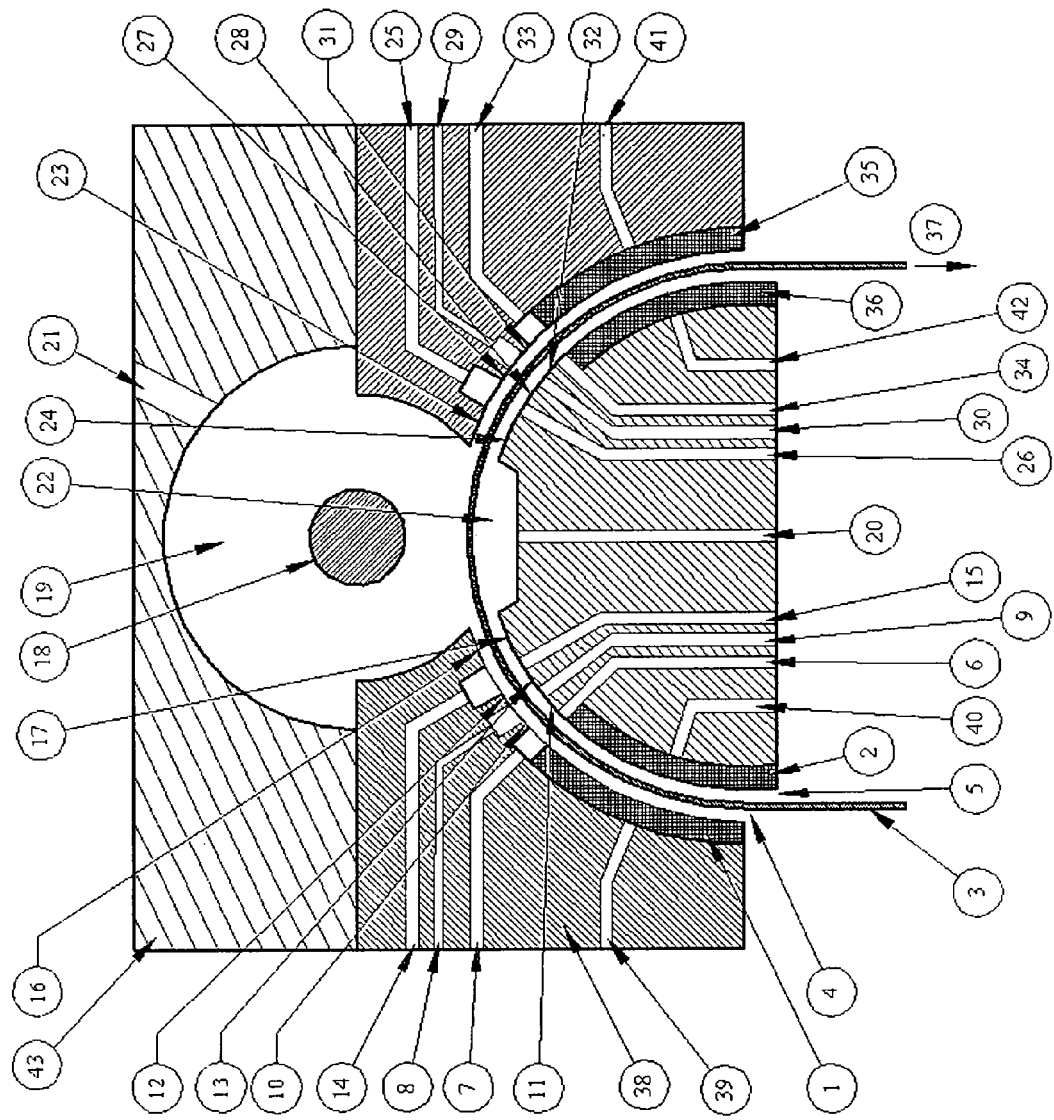
FIG. 2 is a schematic view of a Chemical vapor deposition, Plasma vapor deposition/Baking/Annealing process showing the vertically opposed aerostatic bearings, the substrate, and the attendant pressures of areas within the apparatus, however the substrate is a web of continuous film material, and the support bearing is curved.

In yet another embodiment, FIG. 2 represents the coating of a flexible substrate, through a process such as a Chemical Vapor Deposition (CVD) method or a Plasma vapor deposition (PVD) method. These methods require a vacuum in order to be viable, and as is disclosed in U.S. Pat. No. 6,163,033 Smick (enclosed herein for reference) through the use of differentially pumped grooves, for forming a moving dynamic seal is here so employed. A flexible substrate 3, such as used in the film substrate industry, is passed in a direction 37 between two aerostatic bearings 1, 2 vertically disposed one over the other, however each forming part of a radius that share an equal center. The size of the radius is immaterial and given to particular constraints of the process, not here named. The bearings are charged with a gas, either nitrogen, carbon dioxide or air, or some other such gas, through grooves 39, 40 supplied in the apparatus housing 38 at a pressure of roughly 60 Psi. The bearings 1, 2 are disposed around the substrate 3 in such a way as to form narrow gaps 4, 5 which cause equal pressure build up from the bearings, displacing the substrate in the center of the bearings, creating a non-contact situation. These bearings are substantially parallel and co-linear to the other bearings and lands within the apparatus, allowing a consistent thin gap 4, 5 to be formed between substrate 3 and the various lands. Immediately adjacent to the aerostatic bearings 4, 5 are axial grooves 6, 7 which are ambient grooves, designed to allow the air or fluid flowing off of aerostatic bearings 4, 5 to be naturally displaced, back to ambient air. Further into the apparatus in direction of substrate travel 37, separating axial grooves 6, 7 from a further set of axial grooves 8, 9, are two lands, 10, 11. These lands are substantially co-linear to the other lands, allowing a consistent thin gap 4, 5 to be formed between substrate 3 and the various lands, and match the radius established through aerostatic bearings 1, 2. These grooves 8, 9 are attached to a roughing vacuum pump (not shown) which normally would be of the type of rotary vane vacuum pumps, typically with up to 30 cubic feet per minute of flow, but possibly more or less. These grooves 8, 9 are designed to scavenge air flowing over lands 10, 11 from ambient grooves 6, 7 and air escaping from bearings 1, 2. Grooves 8, 9 are designed to direct the majority of air flowing into the apparatus through narrow gaps 4, 5 between substrate 3 and the various lands, away, and out of the apparatus. Immediately adjacent to grooves 8, 9 in the direction of substrate 3 travel 37 are lands 12, 13. These lands are substantially co-linear to the other lands, allowing a consistent thin gap 4, 5 to be formed between substrate 3 and the various lands, and match the radius established through aerostatic bearings 1, 2. Adjacent to lands 12, 13 are axial grooves 14, 15. Said passages are connected to any number of means of vacuum type apparatus, for instance Vacuum Molecular turbo pumps (not shown) and the like in order to create a vacuum within the grooves of $10^{-4}$ Torr or −5.3 Millibars. Grooves 14, 15 are then able to fully evacuate any air that leaked past grooves 8, 9 while at the same time maintaining equal pressure upon the substrate 3. Immediately adjacent to grooves 14, 15 is land 16, 17. These lands are substantially co-linear to the other lands, allowing a consistent thin gap 4, 5 to be formed between substrate 3 and the various lands, and match the radius established through aerostatic bearings 1, 2. Lands 16, 17 separate grooves 14, 15 from the main chamber 19. Chamber 19 is axially arranged, and represents a large cutout within the apparatus 38 yet is completely contained therein. There is a mirror, axially arranged chamber 22 immediately opposite chamber 19, which is smaller volumetrically, but represents the same surface area on the substrate 3. Both chambers are kept near a pressure of $10^{-4}$ Torr or −5.3 Millibars so that the pressure on the substrate 3 is maintained as equal, so as not to cause undue material deflection via channels 21, 20 which are attached to a Vacuum Molecular turbo pump(s) or similar apparatus (not shown). However chamber 22 is kept at a slightly higher pressure than chamber 19 so that the small pressure differential causes the film substrate 3 to maintain its arc shape with a radius similar to that established through the radius in aerostatic bearings 1, 2. Careful control and calibration (not shown) is required to maintain the arcuate shape of the substrate 3. The pressure maintained in chambers 19, 22 is at or very near the pressure of grooves 14, 15 and is designed to remove enough air or ambient gas in order to maintain an environment suitable for CVD. Within chamber 19 is placed a CVD (Chemical Vapor Deposition) apparatus 18 which is heated through alternate means (not shown) and creates a vapor (not shown) which condenses evenly on all exposed surfaces, including the flexible film substrate 3. The process allows for precise surface deposition. The speed with which the substrate 3 is moved through the apparatus, and the rate with which the CVD process is operated dictate the layer thickness, and each can be modified to suit desired manufacturing goals. As the substrate leaves the chambers 19, 22, the process of lands and successive grooves is reversed, in that lands are formed 23, 24 in order to separate axial grooves 25, 26 from chambers 19, 22 and are pumped via Turbo Molecular pumps (not shown) in order to create a pressure of $10^{-4}$ Torr or −5.3 Millibars within the groove. These lands are substantially co-linear to the other lands, allowing a consistent thin gap 4, 5 to be formed between substrate 3 and the various lands, and match the radius established through aerostatic bearings 1, 2. Immediately adjacent to grooves 25, 26 is lands 27, 28 which lands are substantially co-linear to the other lands, allowing a consistent thin gap 4, 5 to be formed between substrate 3 and the various lands, and match the radius established through aerostatic bearings 1, 2. Further in direction of substrate travel 37 are axial grooves 29, 30, which are pumped via a rotary vane vacuum pump (not shown) to scavenge air that will be flowing between thin gaps 4, 5 formed by the substrate 3 and aerostatic bearings 35, 36. Immediately adjacent to grooves 29, 30 in direction of substrate travel 3 are lands 31, 32, which lands are substantially co-linear to the other lands, allowing a consistent thin gap 4, 5 to be formed between substrate 3 and the various lands, and match the radius established through aerostatic bearings 1, 2. These lands separate grooves 29, 30 from ambient axial grooves 33, 34. The ambient groove vents to atmosphere outside of the apparatus, in order to allow air to flow evenly off of the surface of the aerostatic bearings. Immediately adjacent to ambient grooves 33, 34 are aerostatic bearings 35, 36 essentially horizontally disposed opposite one another, and match the radius established through aerostatic bearings 1, 2, through which 60 Psi air pressure or some other fluid as may be desired for a given process, such as carbon dioxide or nitrogen is passed in order to impinge on the surface of the substrate equally and cause it to remain substantially between them in a non-contact state. A thin gap is created 4, 5 and this gap is maintained throughout the travel of substrate 3 through the apparatus, maintaining its non-contact orientation.

In a further embodiment, a similar apparatus is created, however chamber 22 is made to be similarly disposed in size and orientation as chamber 19, thereby allowing a CVD apparatus to be placed within chamber 22 (not shown). This allows the deposition of material onto both sides of the substrate, for various unique applications. Subsequently, the internal pressure of chamber 22 is slightly higher than that of chamber 19, in order to maintain the essentially arcuate shape of the flexible substrate 3. The attendant pressures and apparatus embodiment can be substantially similar, but not necessarily so. Any combination of pressures or vacuum related chambers is anticipated by the inventor, and is not specifically limited to the foregoing.

Within the above embodiment in FIG. 2, chamber 19 may contain any number of different processing devices, namely baking apparatus 18 through the use of Ultra-Violet radiation, Radiant heat, Plasma heating, Nuclear radiation, annealing, rapid thermal processing and numerous other types of processing conditions as will be apparent to one so skilled in the art. The construction of the chamber 19 can be arranged thus with coatings or shielding as is appropriate to the process. Intense heat can be created for the purposes of baking the substrate 3, as may be required for the curing of a process or coating, and the speed of movement of the substrate 3 can be modified to affect the desire result. A second matching chamber 22 immediately below the upper chamber 19 and equal in size, can hold the same apparatus (not shown) in order to effect baking on both sides of the substrate.

Combination of Stages—Flexible Substrates

Figure 3:
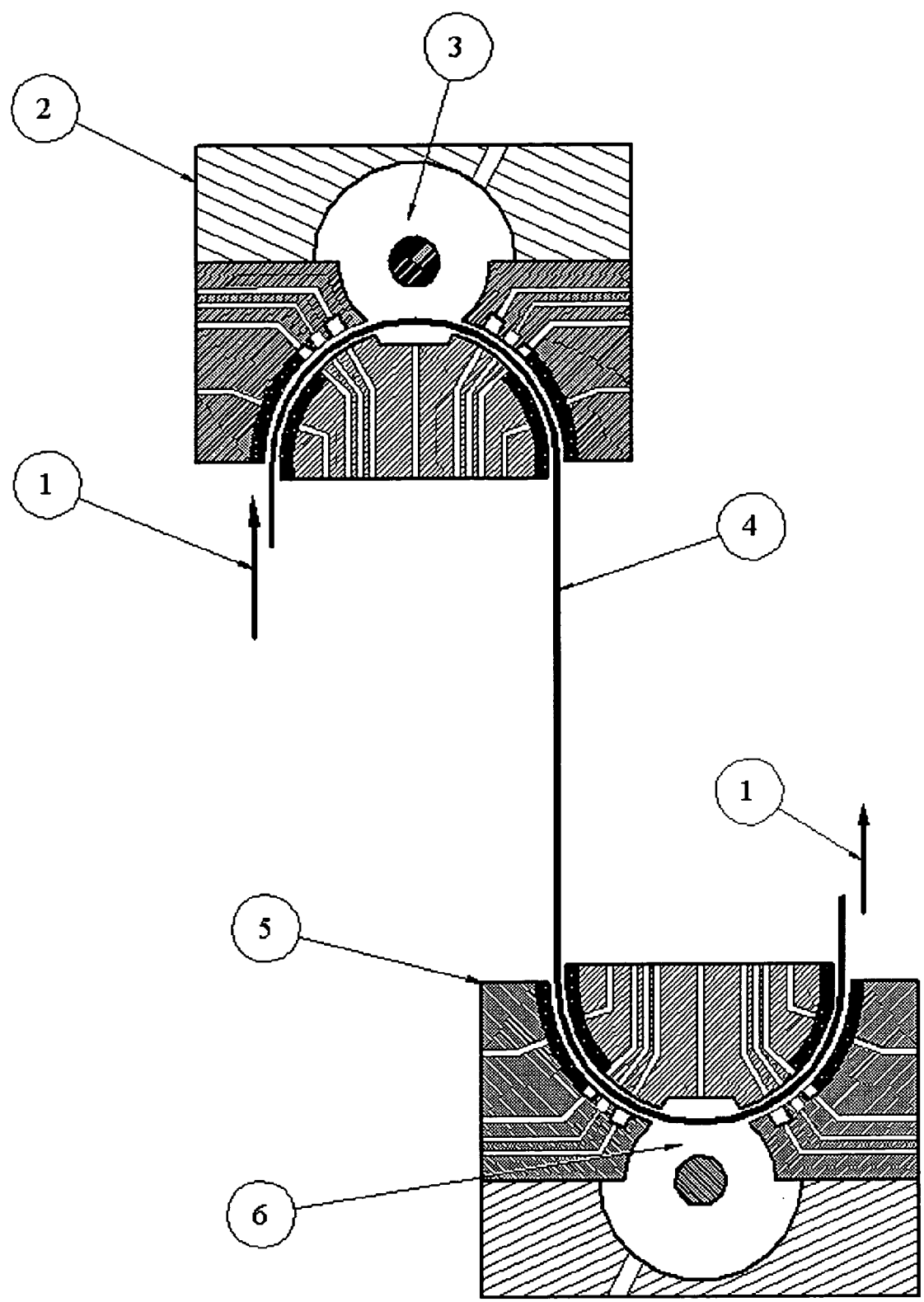
FIG. 3 is a schematic view of an embodiment detailing a multiple, simultaneous coating applied to a flexible web substrate.

As can be seen by FIG. 3 a multi stage process method is incorporated in an embodiment detailed above into apparatus 2 which is coupled simultaneously with a similar Coating—Flexible substrates apparatus 5, upon the same web of flexible substrate 4. The coating CVD process 3 is followed immediately after with a similar or different coating material via the CVD process 6 on the substrate 4 in direction 1. As may be deduced from the art any type of process may be substituted for the coating 6 process, such as baking, or similar process. As should be apparent to one skilled in the art, multiple stages of various different processes may be utilized in the present disclosure simultaneously, or independently, or in multiple configurations for the purpose of manufacturing flexible webs utilizing baking and coating. It may also be readily observed that the patentee desires to anticipate further developments in the art of flexible substrates processed in a vacuum environment that are currently not invented, and should be considered as a possible further manufacturing or processing step by those familiar with the art regarding the proposed apparatus and or method in simultaneous fashion or successively, as well as in this patent regarding successive and simultaneous processing of flexible substrates.

SUMMATION

It will be readily apparent to those skilled in the art that various modifications and variations can be made in the apparatus for cleaning, drying, baking, and etching glass substrate and semi-conductor industry wafers of the present invention without departing from the spirit or scope of the invention. Thus, it is intended that the present invention cover the modifications and variations possible of this invention in method and or apparatus provided they come within the scope of the claims and appended claims and their equivalents.

What is claimed is:

1. A method for containing a substrate while passing the substrate through a processing chamber, the method comprising:
    (a) providing a plurality of vacuum chambers employing differentially pumped grooves that provide successive areas of lower pressure, the plurality of vacuum chambers defining a passageway for the substrate to pass through at least one processing chamber;
    (b) providing opposing non-contact bearings for constraining the substrate in the passageway, the bearings separating the successive areas of lower pressure
    (c) continuously passing the substrate through the passageway in a non-contact manner, such that at a same time, part of the substrate is entering the plurality of vacuum chambers, part of the substrate is moving within the plurality of vacuum chambers, and part of the substrate is exiting the vacuum chambers.

2. The method of claim 1, wherein step (c) comprises balancing pressures on both sides of the substrate.

3. The method of claim 1, wherein the at least one processing chamber allows vacuum processing of the substrate.

4. The method of claim 1, wherein
    the opposing non-contact bearings are opposing hydrostatic bearings for constraining the substrate.

5. The method of claim 1, further comprising baking the substrate in the at least one processing chamber.

6. The method of claim 5, wherein the step of baking comprises using a form of heating selected from the group consisting of ultra-violet radiation, plasma heating, radiant heat, nuclear radiation, rapid thermal processing and annealing.

7. The method of claim 1, further comprising coating at least one side of the substrate by vacuum deposition processing.

8. The method of claim 7, wherein both sides of the substrate are coated with the same or different materials, in varying thicknesses independent of each other.

9. The method of claim 8, wherein the sides of the substrate are coated using vertically opposed chemical vapor deposition chambers.

10. The method of claim 1, further comprising:
operating said at least one processing chamber to constrain a fluid or vapor for a coating process;
balancing pressures on both sides of the substrate; and
coating at least one side of the substrate by said coating process.

11. The method of claim 10, wherein the fluid or vapor is used as a hydrostatic bearing medium.

12. The method of claim 1, wherein the non-contact bearings are concentrically curved.

13. The method of claim 1, wherein the substrate is flexible.

14. The method of claim 13, wherein the substrate is a flexible web that is maintained flat in the at least one processing chamber.

15. The method of claim 13, wherein the substrate is a flexible web that is maintained in a curved state in the at least one processing chamber.

16. The method of claim 1, further comprising performing a plurality of substrate processing steps on the substrate.

17. The method of claim 16, wherein the processing steps are performed in succession.

18. The method of claim 1, wherein the non-contact bearings comprise a porous material.

19. The method of claim 1, further comprising: keeping the substrate under tension as the substrate passes through the passageway.

20. The method of claim 1 wherein the bearings are arranged in two mirrored arrays that are equal in size and number so that as the substrate leaves said at least one processing chamber the substrate is brought back to ambient temperature and pressure, while also sealing said processing chamber from ingress of air, particles, dirt, or temperature fluctuations.

* * * * *